United States Patent [19]
Yang

[11] Patent Number: 5,547,895
[45] Date of Patent: Aug. 20, 1996

[54] METHOD OF FABRICATING A METAL GATE MOS TRANSISTOR WITH SELF-ALIGNED FIRST CONDUCTIVITY TYPE SOURCE AND DRAIN REGIONS AND SECOND CONDUCTIVITY TYPE CONTACT REGIONS

[75] Inventor: Sheng-Hsing Yang, Hsinchu, Taiwan

[73] Assignee: United Microelectronics Corp., Hsinchu, Taiwan

[21] Appl. No.: 299,217

[22] Filed: Aug. 31, 1994

[51] Int. Cl.$^6$ .............. H01L 21/70; H01L 27/00; H01L 21/302; H01L 21/304
[52] U.S. Cl. .............. 437/57; 437/63; 437/69; 437/70; 437/72
[58] Field of Search .............. 437/29, 41, 57, 437/41 SM, 63, 70, 69, 72

[56] References Cited

U.S. PATENT DOCUMENTS

| | | | |
|---|---|---|---|
| 4,078,947 | 3/1978 | Johnson et al. | 437/41 |
| 4,282,647 | 8/1981 | Richman | 437/70 |
| 4,766,090 | 8/1988 | Coquin et al. | 437/63 |
| 4,994,407 | 2/1991 | Custode et al. | 437/70 |
| 5,024,961 | 6/1991 | Lee et al. | 437/57 |
| 5,270,562 | 12/1993 | Wuidart | 257/315 |
| 5,382,820 | 1/1995 | Yang et al. | 437/63 |

*Primary Examiner*—Mary Wilczewski
*Assistant Examiner*—Brian K. Dutton
*Attorney, Agent, or Firm*—Ladas & Parry

[57] ABSTRACT

A method for manufacturing a CMOS transistor of integrated circuits having metal gates and self-aligned source and drain electrodes. The channel length can be precisely defined, and the leakage current can be reduced. Furthermore, the threshold voltage of the transistor can be increased by implanting impurities into the well or the substrate.

16 Claims, 14 Drawing Sheets ly shown in FIGS. 1a to 1g are cross sectional views showing a

METHOD OF FABRICATING A METAL GATE MOS TRANSISTOR WITH SELF-ALIGNED FIRST CONDUCTIVITY TYPE SOURCE AND DRAIN REGIONS AND SECOND CONDUCTIVITY TYPE CONTACT REGIONS

BACKGROUND OF THE INVENTION

The present invention relates to the field of manufacturing semiconductor integrated circuit (IC) devices, and more particularly, to a method of fabricating metal gate complementary metal oxide semiconductor (CMOS) transistors with self-aligned source and drain regions.

In the present state of art, methods for manufacturing CMOS transistors in an integrated circuit which has a polysilicon gate electrode layer usually include a self-alignment technique to form the source and drain electrodes. As such, difficulties due to misalignment are reduced. Unfortunately, prior art self-alignment techniques cannot be utilized to produce a metal gate CMOS transistor. As a result, the channel length of the metal gate CMOS transistor cannot be as precisely defined as is desired. The resulting misalignment results in a larger leakage of current, and the metal gate cannot precisely cover the source region and the drain regions, and therefore the performance of the CMOS is reduced.

SUMMARY OF THE INVENTION

The primary object of the present invention is to provide a method for fabricating a metal gate CMOS transistor, which has the advantage of self-alignment.

Another object of the present invention is to provide a method for fabricating a metal gate CMOS transistor, which has a precise channel length.

Another object of the present invention is to provide a method for fabricating a CMOS transistor with a lower leakage current.

Another object of the present invention is to provide a method for fabricating a CMOS transistor with a higher threshold voltage.

The objects of the present invention are fulfilled by providing a method for fabricating a metal gate MOS transistor of a first conductivity type on an substrate of the first conductivity type. The method comprises the following steps: (a) implanting an impurity of a second conductivity type into a predetermined position of said substrate and driving in, to form a well of the second conductivity type in said substrate; (b) forming a masking layer on the well of the second conductivity type at predetermined positions; (c) forming first field oxides; (d) removing the first field oxides; (e) implanting impurities of the first and second conductivity types into predetermined positions in the well of the second conductivity type by self-alignment using said masking layer as a mask, to form first conductivity type source and drain electrodes of said NMOS transistor and second conductivity type contact regions of the well of the second conductivity type; (f) forming second field oxides; (g) forming a gate oxide and on a predetermined position and vias on predetermined positions of said second field oxides; and (h) forming a metal gate of said MOS transistor of the first conductivity type over said gate oxide and metal contacts of said source and drain electrodes and said second contact region.

BRIEF DESCRIPTION OF THE FIGURES

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENT

The method is suitable for making a MOS transistor of a first and second conductivity type (such as a NMOS transistor 20 shown in FIG. 1g, or a PMOS transistor 22 shown in FIG. 2g) on a substrate of a first conductivity type (such as the N-type substrate, or a P-type substrate, although an N-type substrate 1 is utilized in the description of the present invention.) The disclosed fabrication method is particularly characterized by the formation of self-aligned source/drain regions and is described below:

FIGS. 1a to 1g show the first preferred embodiment of the present invention, which is applied to an N type substrate 1 to produce a metal gate NMOS transistor. The method is described below:

STEP 1

Figure 1A:
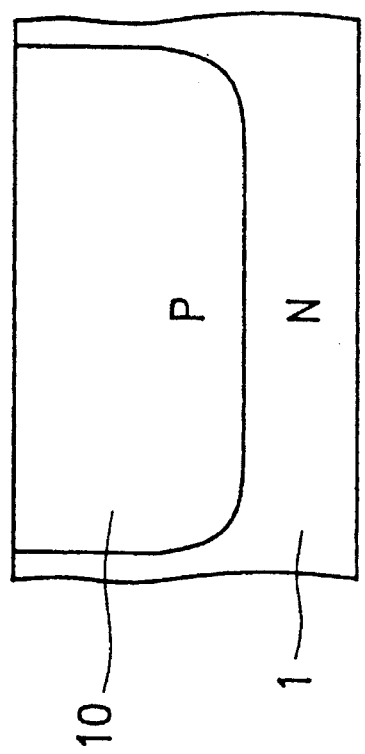
FIGS. 1a to 1g are cross sectional views showing a method of manufacturing a metal gate NMOS transistor on an N type substrate according to the present invention.

As shown in FIG. 1a, a P well 10 is formed in an N type substrate 1. This step may be done by various conventional methods well understood by those skilled in this art. For example, a photoresist (not shown in the figures) may be applied over the substrate 1. The predetermined position for the P well in the photoresist is removed by lithography technology. After that, P type impurity is implanted and driven into the substrate, to form the P well 10.

STEP 2

Figure 1B:
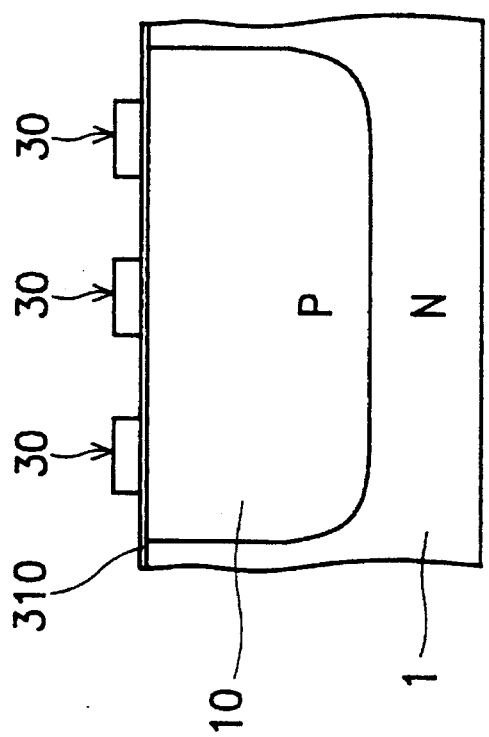

As shown in FIG. 1b, a masking layer 30 is formed on the P well 10 using conventional techniques. This step may be done by various conventional methods well understood by those skilled in the art. For example, a pad oxide 310 may be formed by thermal oxidation or chemical vapor deposition (CVD) with a thickness of about 200 Å to 1 kÅ. Then a nitride layer is deposited with a thickness of about 1 kÅ to 2.5 kÅ. The nitride layer is then patterned by conventional lithography techniques and reactive ion etching (RIE) techniques to form the masking layer 30.

STEP 3

Figure 1C:
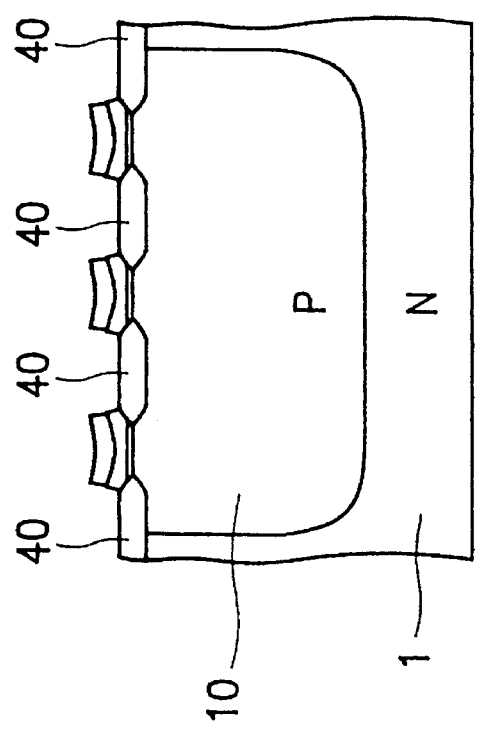

First field oxides 40 are formed between the nitride layer 320 by thermal oxidation to a thickness of 3 kÅ to 10 kÅ, as shown in FIG. 1c.

STEP 4

Figure 1D:
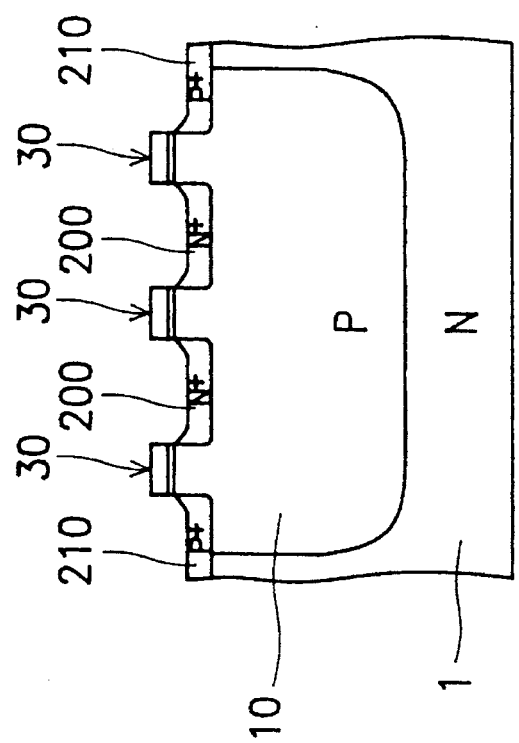

The first field oxides 40 are removed by conventional etching method using the nitride layer as a mask, as shown in FIG. 1d. Next, P type impurity is implanted into the P well 10 to form $P^+$ contact regions 210. N type impurity is implanted into the P well 10 to form $N^+$ source and drain electrode regions 200. Both two implantations are done by using the masking layer 30 as a portion of mask. Therefore, the N⁺ source and drain electrode regions 200 and the P⁺ contact regions 210 are formed self-aligned since the thickness of layer 30 is sufficiently thick to stop both of the implantations. In order to implant both P and N type impurities, that two separate masking, patterning and mask removal sequences are used. The masks would be patterned so that their edges land on the tops of masking layer 30. For example, a photoresist layer is coated and patterned. P type and N type impurities are then implanted. At last the photoresist layer is removed.

STEP 5

Figure 1E:
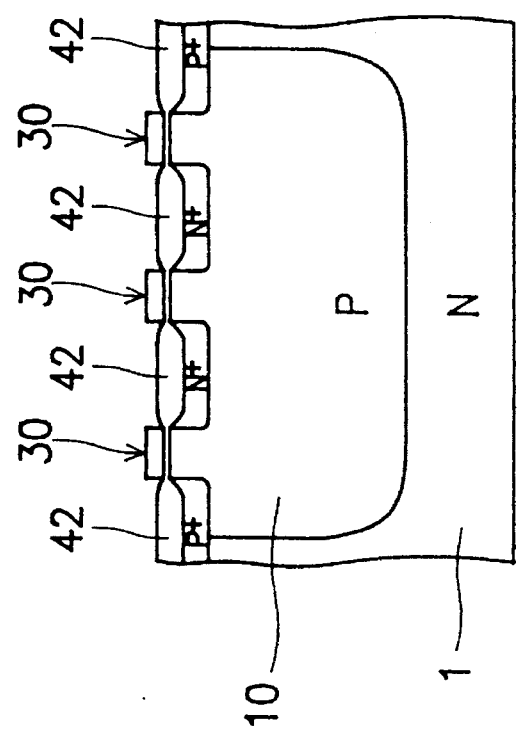

As shown in FIG. 1e, second field oxides 42 are grown by thermal oxidation to a thickness of 3 kÅ to 10 kÅ. Then the masking layer 30 is removed to expose the underlying P-well 10.

STEP 6

Figure 1F:
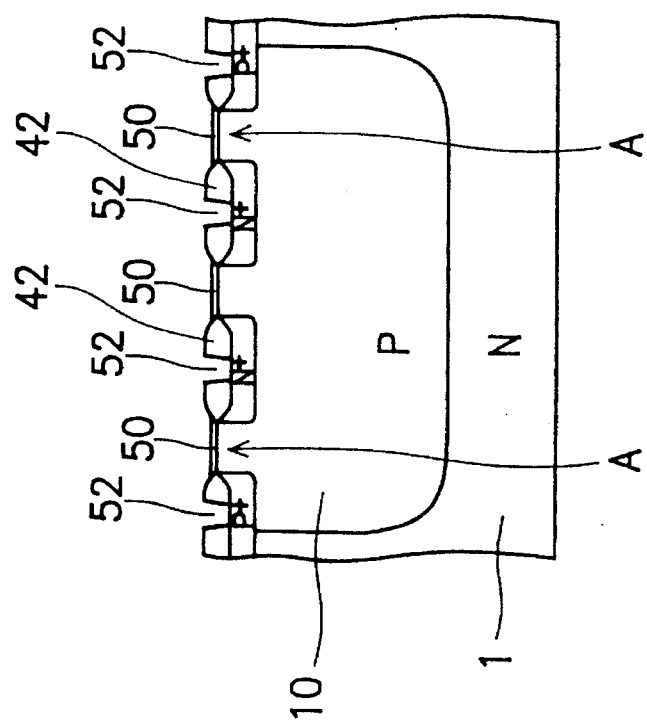

The threshold voltage of the NMOS transistor can be increased, if desired, by implanting P-type impurities, such as boron ions, into the regions A of the P-well 10 which are located between the N⁺ source and drain electrode regions 200 and the P⁺ contact regions 210, as shown in FIG. 1f. Then, gate oxides 50 are formed between the second field oxides 42 and over regions A. This can be done by, for example, thermally growing the gate oxides 50 in a suitable oxidizing atmosphere. Referring again to FIG. 1f, vias 52 are formed in the second field oxides 42 by conventional lithography and etching techniques.

STEP 7

Figure 1G:
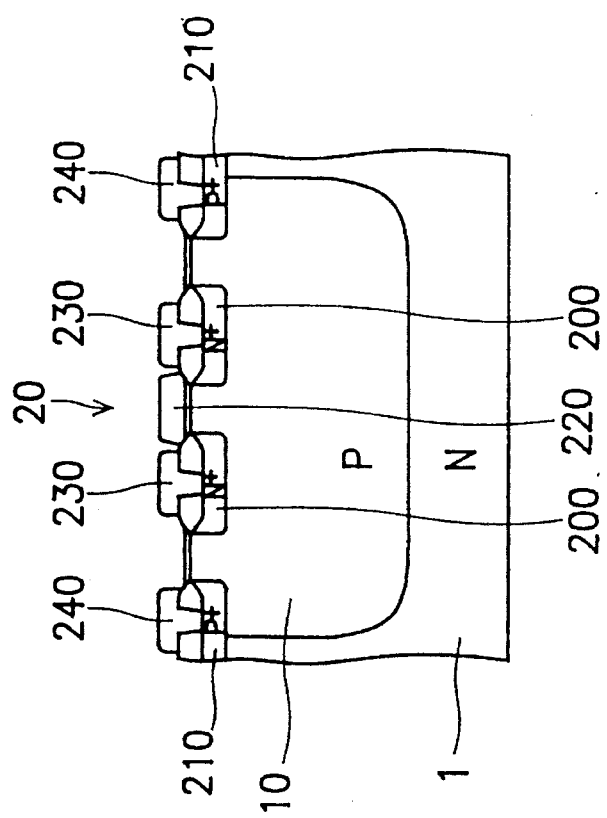
Figure 4A:
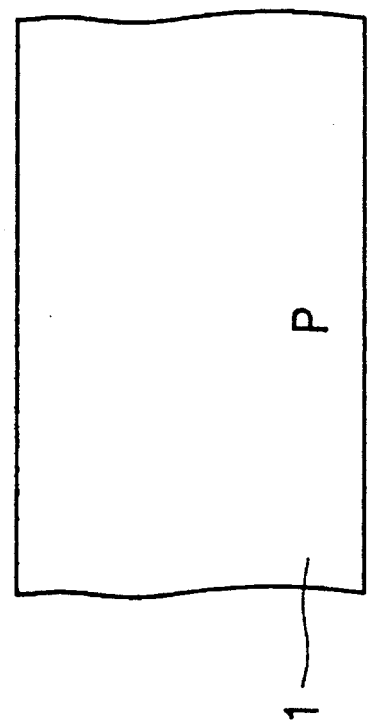
FIGS. 4a to 4g are cross sectional views showing a method of manufacturing a metal gate NMOS transistor on an P type substrate according to the present invention.
Figure 3A:
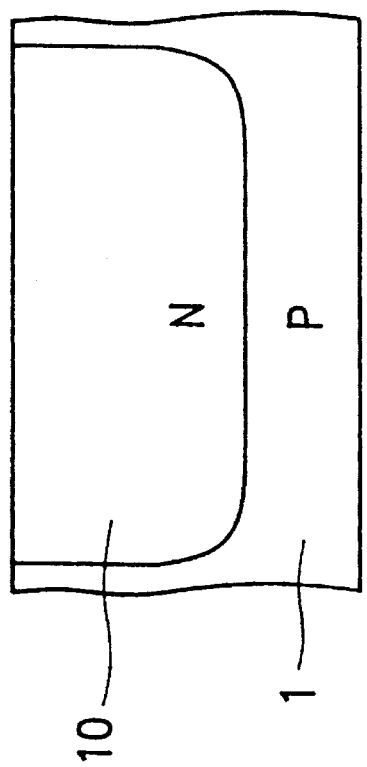
FIGS. 3a to 3g are cross sectional views showing a method of manufacturing a metal gate PMOS transistor on an P type substrate according to the present invention.
Figure 4B:
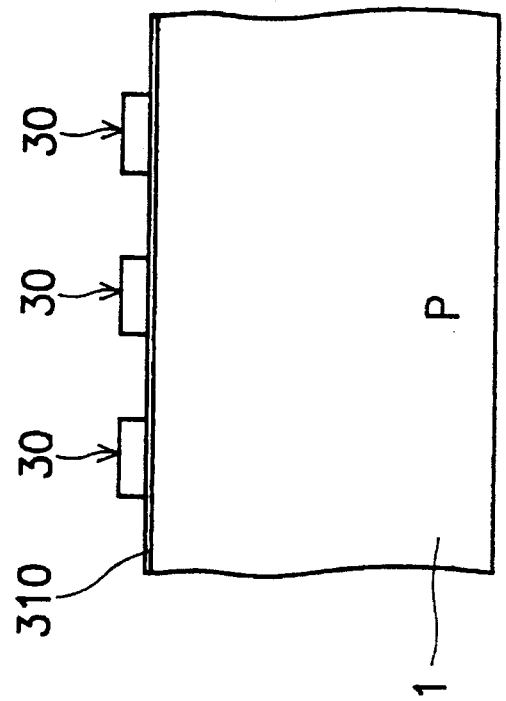
Figure 3B:
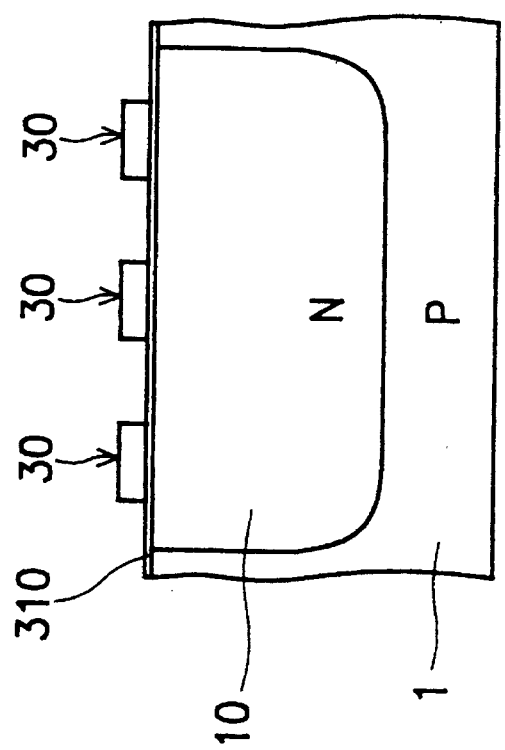
Figure 3C:
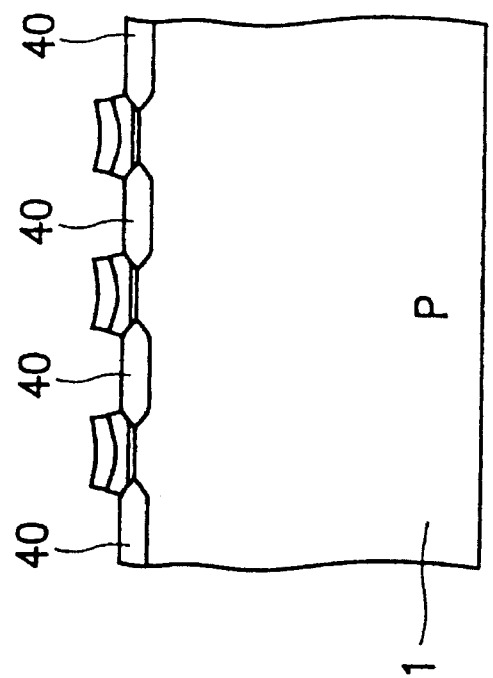
Figure 4C:
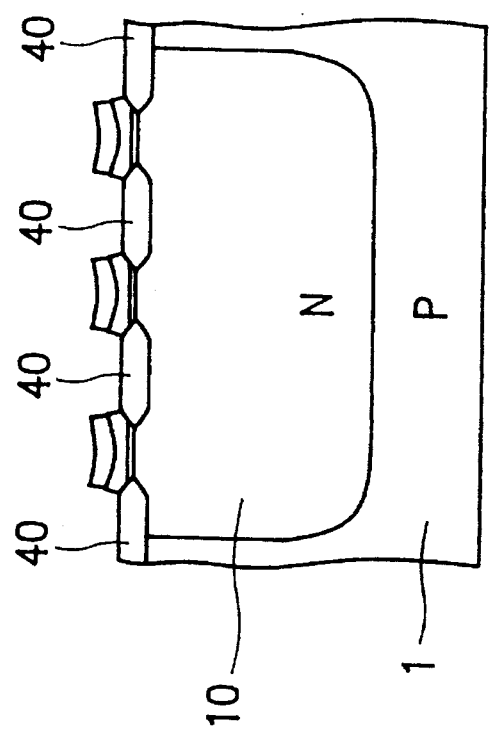
Figure 4D:
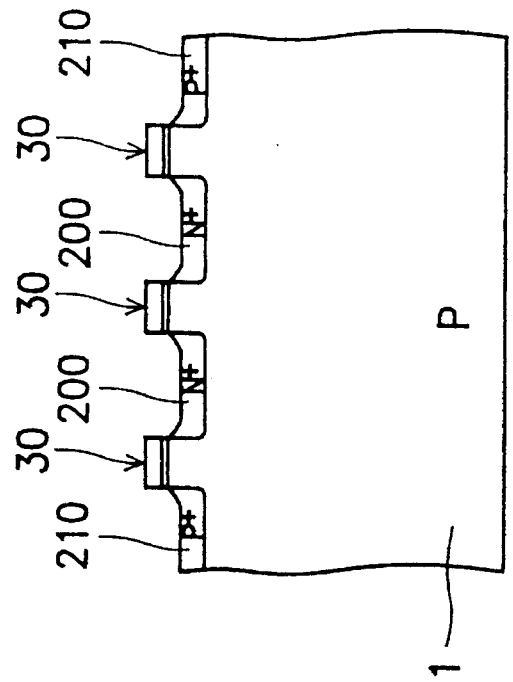
Figure 3D:
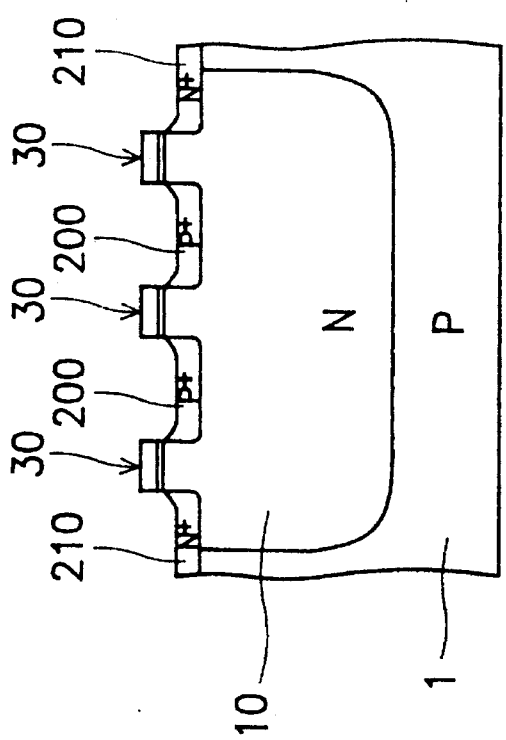
Figure 4E:
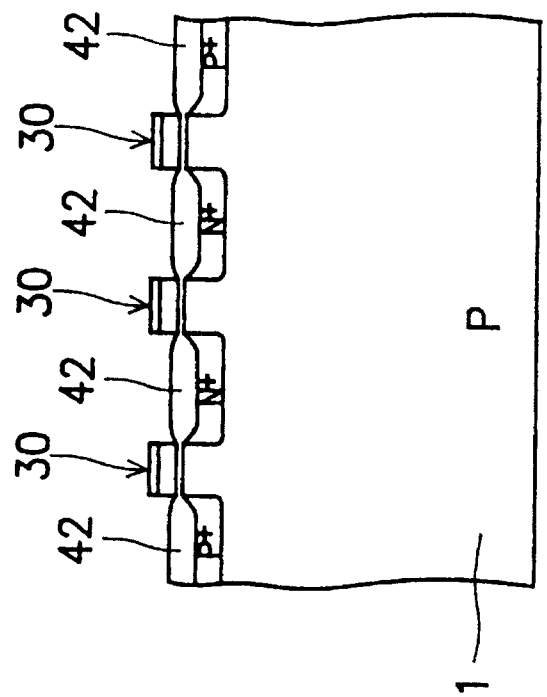
Figure 3E:
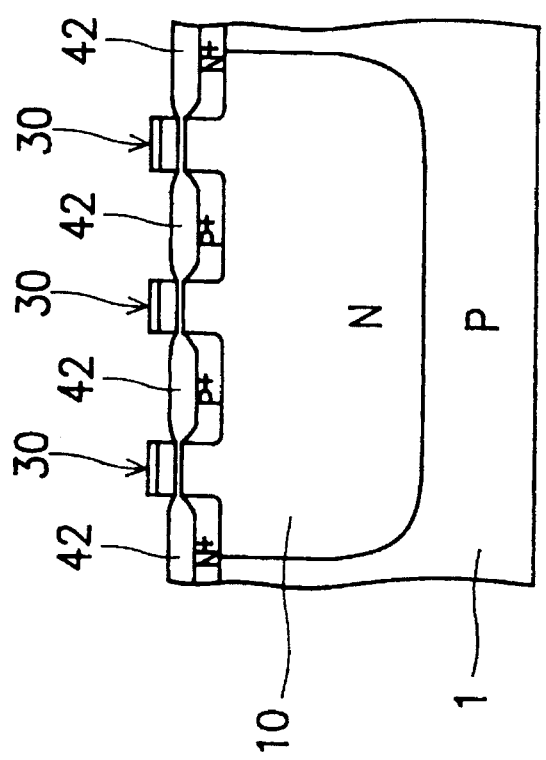
Figure 4F:
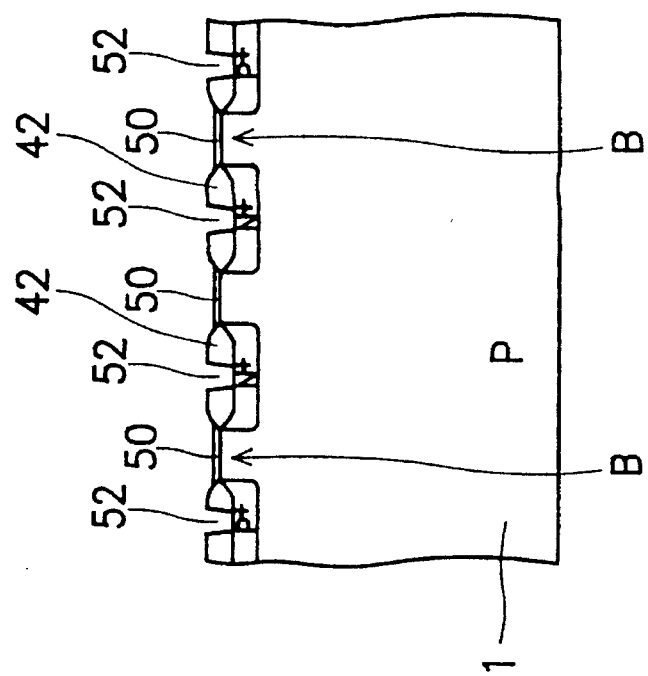
Figure 3F:
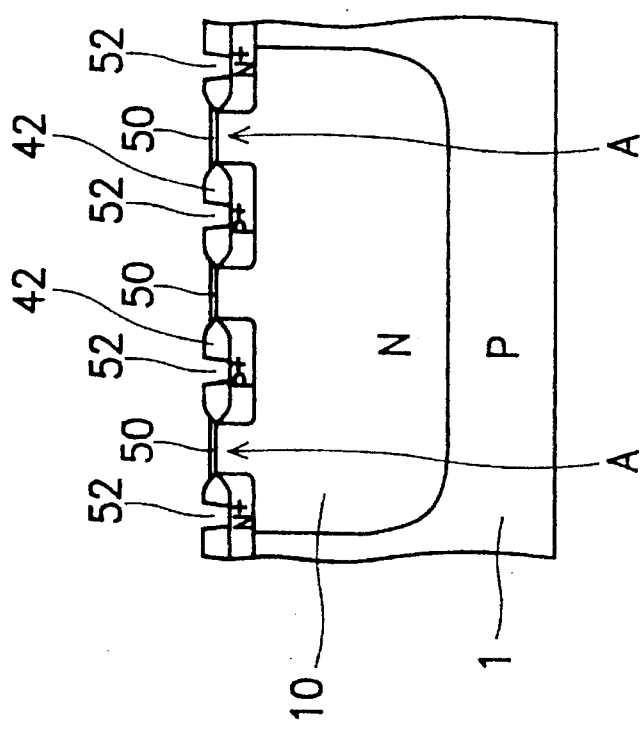
Figure 4G:
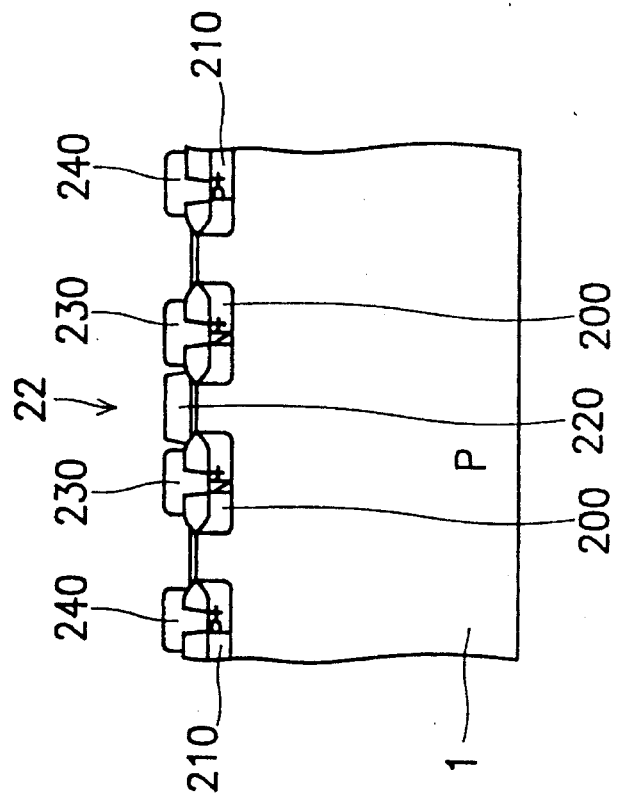
Figure 3G:
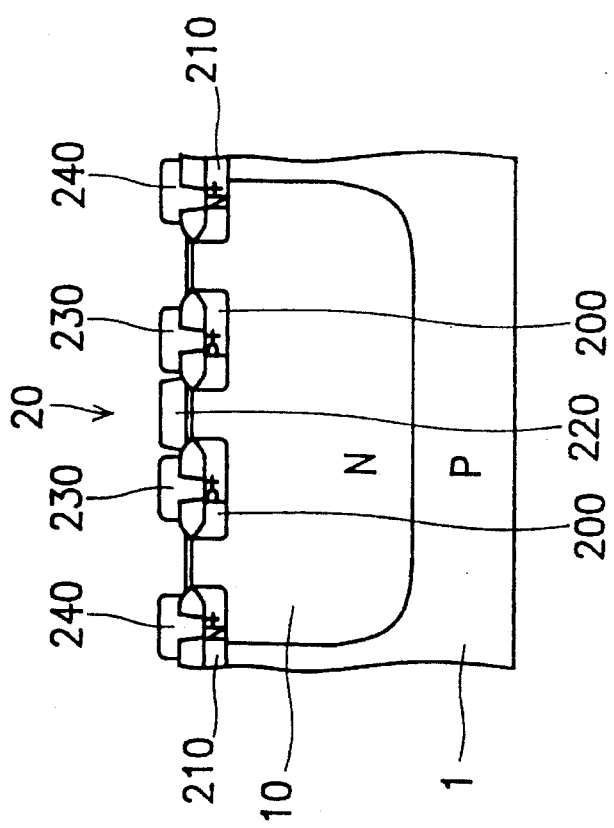

As shown in FIG. 1g, a metal layer, like Al—Si—Cu, is deposited and patterned using conventional techniques to form a metal gate 220 of the NMOS transistor 20, and metal contacts 230 for the N⁺ source and drain electrode regions 200, and metal contacts 240 for the P⁺ contact regions 210. This is done by conventional deposition, lithography, and etching steps that are well understood by those skilled in the art.

Another embodiment of the present invention, which is applied to an N type substrate 1 to produce a metal gate PMOS transistor, is described herein below. For convenience, similar elements are labeled with same numerals as that of the first embodiment.

STEP 1

Figure 2A:
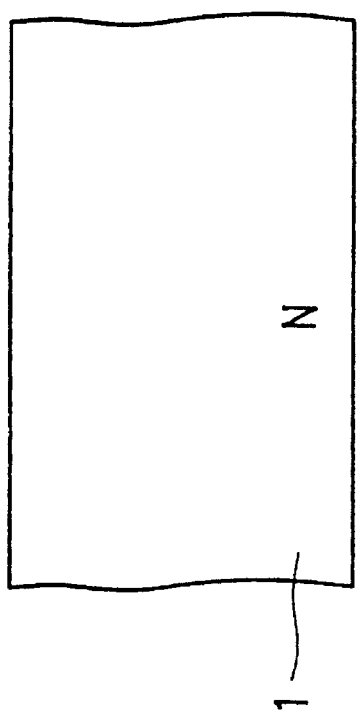
FIGS. 2a to 2g are cross sectional views showing a method of manufacturing a metal gate PMOS transistor on an N type substrate according to the present invention.

An N type substrate 1 is prepared as shown in FIG. 2a.

STEP 2

Figure 2B:
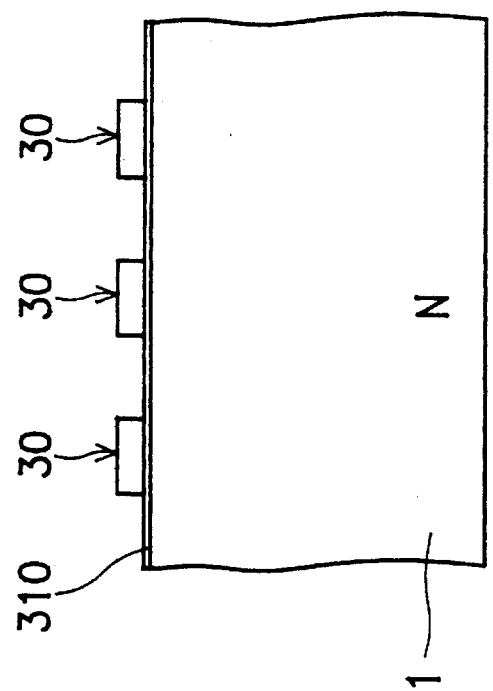

As shown in FIG. 2b, a masking layer 30 is formed on the N type substrate 1 using conventional technique. This step may also be done by various conventional methods understood by those skilled in the field. For example, a pad oxide 310 is firstly formed by thermal oxidation or chemical vapor deposition (CVD) with a thickness of about 200 Å to 1 kÅ. Then a nitride layer is deposited with a thickness of about 1 kÅ to 2.5 kÅ. The nitride layer is then patterned by conventional lithography technique and reactive ion etching (RIE) technique to form the masking layer 30.

STEP 3

Figure 2C:
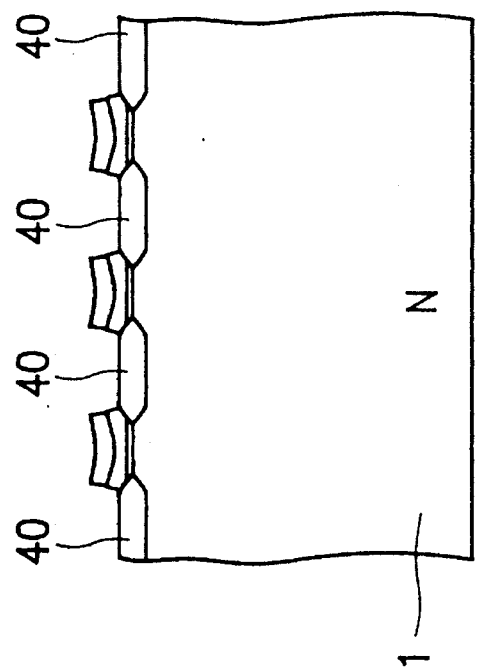

First field oxides 40 are formed between the nitride layer by thermal oxidation to a thickness of 3 kÅ to 10 kÅ, as shown in FIG. 2c.

STEP 4

Figure 2D:
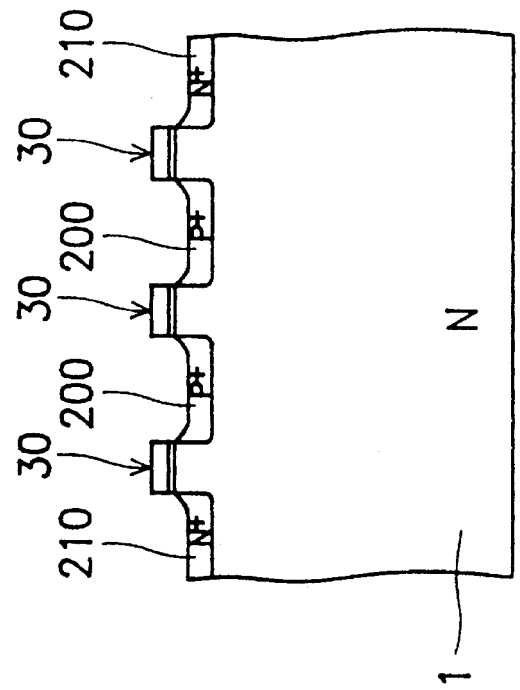

The first field oxides 40 are removed by conventional etching method using the nitride layer as a mask, as shown in FIG. 2d. Next, N type impurity is implanted into the N type substrate 1 to form N⁺ contact regions 210. P type impurity is implanted into the N type substrate 1 to form P⁺ source and drain electrode regions 200. Both two implantations are done by using the masking layer 30 as a portion of mask. Therefore, the P⁺ source and drain electrode regions 200 and the N⁺ contact regions 210 are formed self-aligned since the thickness of layer 30 is sufficiently thick to stop both of the implantations. In order to implant both N and P type impurities, that two separate masking, patterning and mask removal sequences are used. The masks would be patterned so that their edges land on the tops of masking layer 30. For example, a photoresist layer is coated and patterned. N type and P type impurities are then implanted. At last the photoresist layer is removed.

STEP 5

Figure 2E:
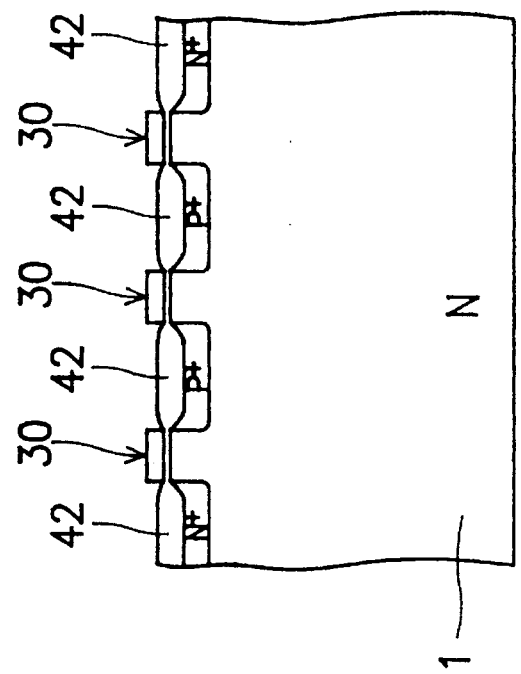

As shown in FIG. 2e, second field oxides 42 are grown by thermal oxidation to a thickness of 3 kÅ to 10 kÅ. Then the masking layer 30 is removed to expose the underlying N type substrate 1.

STEP 6

Figure 2F:
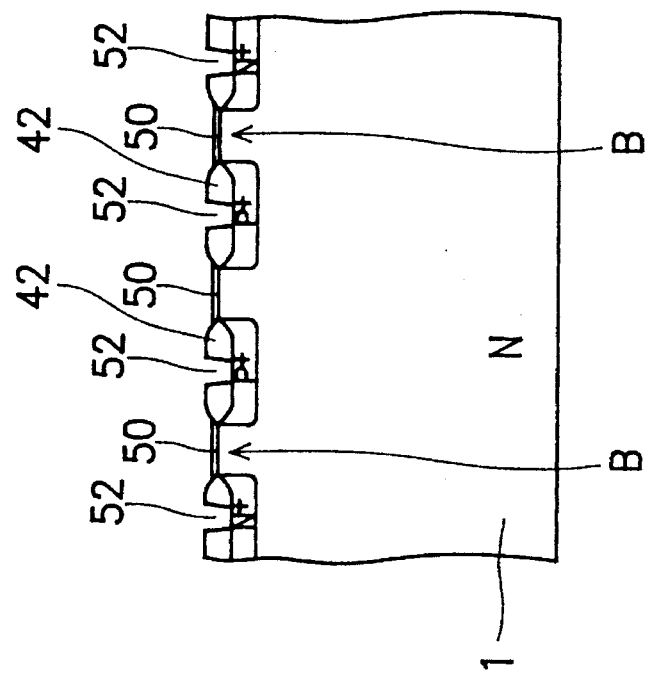

The threshold voltage of the PMOS transistor can be increased, if desired, by implanting N-type impurities, such as phosphorous ions, into the regions B of the N type substrate 1 which are located between the P⁺ source and drain electrode regions 200 and the N⁺ contact regions 210, as shown in FIG. 2f. Then, gate oxides 50 are formed between the second field oxides 42 and over regions B. This can be done by, for example, thermally growing the gate oxides 50 in a suitable oxidizing atmosphere. Referring again to FIG. 2f, vias 52 are formed in the second field oxides 42 by conventional lithography and etching techniques.

STEP 7

Figure 2G:
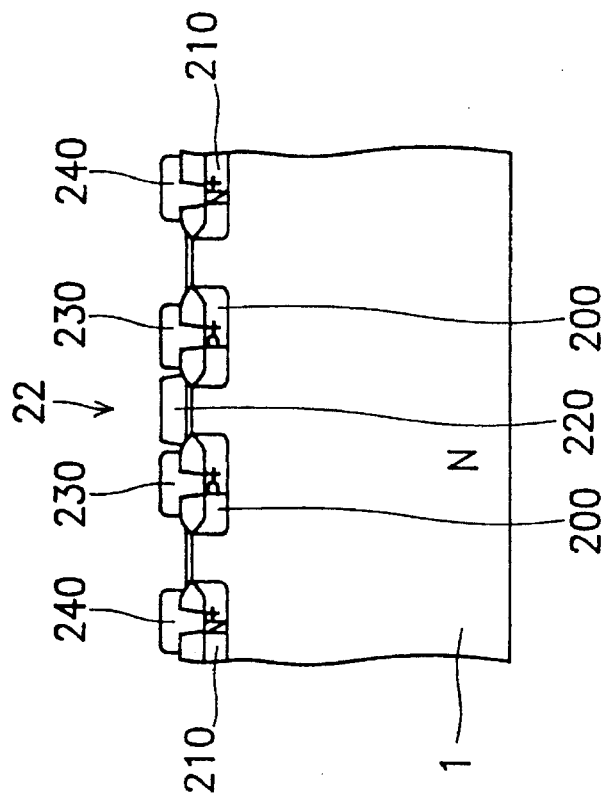

As shown in FIG. 2g, a metal layer, like Al—Si—Cu, is deposited and patterned using conventional techniques to form a metal gate 220 of the PMOS transistor 20, and metal contacts 230 of the P⁺ source and drain electrode regions 200, and metal contacts 240 of the N⁺ contact regions 210. This is done by conventional deposition, lithography, and etching steps that are well understood by those in the art.

The above stated processes for producing NMOS transistors and PMOS transistors may be applied at the same time to produce a complete CMOS transistor. Since the combination is apparent to those skilled in the art, the details are not further discussed.

Although not described in detail, it is apparent that the methods can be applied to a P type substrate to produce a metal gate PMOS transistor as shown in FIGS. 3a to 3g. Another embodiment to produce a metal gate NMOS on a P type substrate is shown in FIGS. 4a to 4g.

As stated above, the NMOS and PMOS transistors made according to the present invention are produced with their source and drain electrode regions being self-aligned. Therefore the channel length can be precisely defined. Moreover, the source and drain regions can be precisely isolated from the contact regions, so that the current leakage of the transistor can be reduced. In addition, since the concentration of impurities in the substrate can be increased by implantation, the breakdown voltage can be increased.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating a metal gate MOS transistor of a first conductivity type on a substrate of the first conductivity type, said method comprising the steps of:

(a) implanting impurity of a second conductivity type into a first position of said substrate and driving in said impurity into said substrate, to form a well of the second conductivity type in said substrate;

(b) forming a masking layer on the well of the second conductivity type at second positions;

(c) forming first field oxides between the masking layer on the well of the second conductivity type;

(d) removing the first field oxides;

(e) implanting impurities of the first conductivity type into third positions in the well of the second conductivity type by self-alignment using said masking layer as a mask to form first conductivity type source and drain electrode regions of said, metal gate MOS transistor and implanting impurities of the second conductivity type into fourth positions in the well of the second conductivity type by self-alignment using said masking layer as a mask to form second conductivity type contact regions of the well of the second conductivity type;

(f) forming second field oxides between the masking layer on the well of the second conductivity type;

(g) forming gate oxides on portions of said substrate between said second field oxides, and forming vias in said second field oxides; and (h) providing a metallization process to form a metal gate over a gate oxide located between the first conductivity type source and drain electrode regions and to form metal contacts for said first conductivity type source and drain electrode regions and metal contacts for said second conductivity type contact regions.

2. The method for fabricating a metal gate MOS transistor of a first conductivity type on a substrate of the first conductivity type as claimed in claim 1, wherein the masking layer includes an oxide layer on said substrate and a nitride layer on said oxide layer.

3. The method for fabricating a metal gate MOS transistor of a first conductivity type on a substrate of the first conductivity type as claimed in claim 2, wherein the first conductivity type is N type and the second conductivity type is P type.

4. The method for fabricating a metal gate MOS transistor of a first conductivity type on a substrate of the first conductivity type as claimed in claim 2, wherein the first conductivity type is P type and the second conductivity type is N type.

5. The method for fabricating a metal gate MOS transistor of a first conductivity type on a substrate of the first conductivity type as claimed in claim 1, wherein the step (e) further includes the step of implanting a second conductivity type impurity between said first conductivity type source and drain electrode regions and said second conductivity type contact regions.

6. The method for fabricating a metal gate MOS transistor of a first conductivity type on a substrate of the first conductivity type as claimed in claim 5, wherein the masking layer includes an oxide layer on said substrate and a nitride layer on said oxide layer.

7. The method for fabricating a metal gate MOS transistor of a first conductivity type on a substrate of the first conductivity type as claimed in claim 6, wherein the first conductivity type is N type and the second conductivity type is P type.

8. The method for fabricating a metal gate MOS transistor of a first conductivity type on a substrate of the first conductivity type as claimed in claim 6, wherein the first conductivity type is P type and the second conductivity type is N type.

9. A method for fabricating a metal gate MOS transistor of a second conductivity type on a substrate of a first conductivity type, said method comprising the steps of:

(a) forming a masking layer on the substrate at first positions;

(b) forming first field oxides between the masking layer on the substrate at the first positions;

(c) removing the first field oxides;

(d) implanting impurities of the first conductivity type into second positions in the substrate of said first conductivity type by self-alignment using said masking layer as a mask to form first conductivity type contact regions of the substrate and implanting impurities of the second conductivity type into third positions in the substrate of said first conductivity type by self-alignment using said masking layer as a mask to form second conductivity type source and drain electrode regions of said metal gate MOS transistor;

(e) forming second field oxides between the masking layer on the substrate;

(f) forming gate oxides and on portions of said substrate between said second field oxides, and forming vias in said second field oxides; and (g) providing a metallization process to form a metal gate over a gate oxide located between second conductivity type source and drain electrode regions and to form metal contacts for said second conductivity type source and drain electrode regions and metal contacts for said first conductivity type contact regions.

10. The method for fabricating a metal gate MOS transistor of a second conductivity type on a substrate of the first conductivity type as claimed in claim 9, wherein the masking layer includes an oxide layer on said substrate and a nitride layer on said oxide layer.

11. The method for fabricating a metal gate MOS transistor of a second conductivity type on a substrate of the first conductivity type as claimed in claim 10, wherein the first conductivity type is N type and the second conductivity type is P type.

12. The method for fabricating a metal gate MOS transistor of a second conductivity type on a substrate of the first conductivity type as claimed in claim 10, wherein the first conductivity type is P type and the second conductivity type is N type.

13. The method for fabricating a metal gate MOS transistor of a second conductivity type on a substrate of the first conductivity type as claimed in claim 9, wherein the step (d) further includes the step of implanting a first conductivity type impurity between said second conductivity source and drain electrode regions and said first conductivity type contact regions.

14. The method for fabricating a metal gate MOS transistor of a second conductivity type on a substrate of the first conductivity type as claimed in claim 13, wherein the masking layer includes an oxide layer on said substrate and a nitride layer on said oxide layer.

15. The method for fabricating a metal gate MOS transistor of a second conductivity type on a substrate of the first conductivity type as claimed in claim 14, wherein the first conductivity type is N type and the second conductivity type is P type.

16. The method for fabricating a metal gate MOS transistor of a second conductivity type on a substrate of the first conductivity type as claimed in claim 14, wherein the first conductivity type is P type and the second conductivity type is N type.

* * * * *